(12) United States Patent
Gao

(10) Patent No.: US 12,114,468 B2
(45) Date of Patent: *Oct. 8, 2024

(54) HIGH-AVAILABILITY LIQUID COOLING SYSTEM FOR CHIP AND SERVER

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 225 days.

This patent is subject to a terminal disclaimer.

(21) Appl. No.: 17/700,755

(22) Filed: Mar. 22, 2022

(65) Prior Publication Data

US 2023/0309270 A1    Sep. 28, 2023

(51) Int. Cl.
*H05K 7/20*    (2006.01)

(52) U.S. Cl.
CPC ..... *H05K 7/20809* (2013.01); *H05K 7/20309* (2013.01); *H05K 7/20327* (2013.01)

(58) Field of Classification Search
CPC ............. H05K 7/20809; H05K 7/2029; H05K 7/20309; H05K 7/20327; H05K 7/20318; G06F 1/20; G06F 1/206; G06F 2200/201; H01L 23/427; F28D 15/0266; F28D 15/043
See application file for complete search history.

(56) References Cited

U.S. PATENT DOCUMENTS

| | | | | |
|---|---|---|---|---|
| 6,525,420 B2* | 2/2003 | Zuo | ....................... | H01L 23/427 257/713 |
| 8,014,150 B2* | 9/2011 | Campbell | .......... | H05K 7/20809 165/185 |
| 9,398,722 B1* | 7/2016 | Sykes | ..................... | F25B 41/33 |
| 2004/0104012 A1* | 6/2004 | Zhou | .................... | H01L 23/427 257/E23.088 |
| 2011/0069453 A1* | 3/2011 | Campbell | .............. | H05K 7/203 361/700 |
| 2014/0071626 A1* | 3/2014 | Campbell | ............... | B23P 15/26 165/165 |
| 2022/0007542 A1* | 1/2022 | Jeong | .................. | H01L 23/3736 |

* cited by examiner

*Primary Examiner* — Stephen S Sul
*Assistant Examiner* — Jeffrey Francis Stoll
(74) *Attorney, Agent, or Firm* — WOMBLE BOND DICKINSON (US) LLP

(57) ABSTRACT

A cooling device for cooling a chip, a server with such a cooling device, and a rack are disclosed. The cooling device comprises a cooling layer that is divided into multiple cooling regions; and an internal region that includes a vapor separation core. Two-phase coolant that enters a first cooling region of the cooling layer is converted to mixed fluid due to heat extracted from a corresponding region of the chip. The mixed fluid is elevated to the vapor separate core, which separates vapor from liquid in the mixed fluid. The vapor exits the cooling device while the liquid is transported to a second cooling region in the cooling layer. The cooling device can be used with a condenser in a server to form an internal server loop, and can be connected to a rack to form a main fluid loop. The two coolant recirculation loops are used together to maintain a predetermined liquid balance in the cooling device.

17 Claims, 8 Drawing Sheets

HIGH-AVAILABILITY LIQUID COOLING SYSTEM FOR CHIP AND SERVER

FIELD OF THE INVENTION

Embodiments of the present disclosure relate generally to cooling systems. More particularly, embodiments of the disclosure relate to a liquid cooling system for high-availability chip and server.

BACKGROUND

An efficient thermal management solution requires a hardware design that is flexible enough to accommodate the ever-changing IT requirements. With the dynamic changes on the semiconductor and chip technologies, as well as the increasing computing capability for different AI workloads, the power density of these chips has increased dramatically. This results in major challenges to thermal designs for cooling devices for serves and racks.

However, existing solutions for two-phase cooling operations do not include vapor separation, which is critical for managing the cooling and fluid recirculation. Existing solutions also do not consider redundant designs for two-phase coolant.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
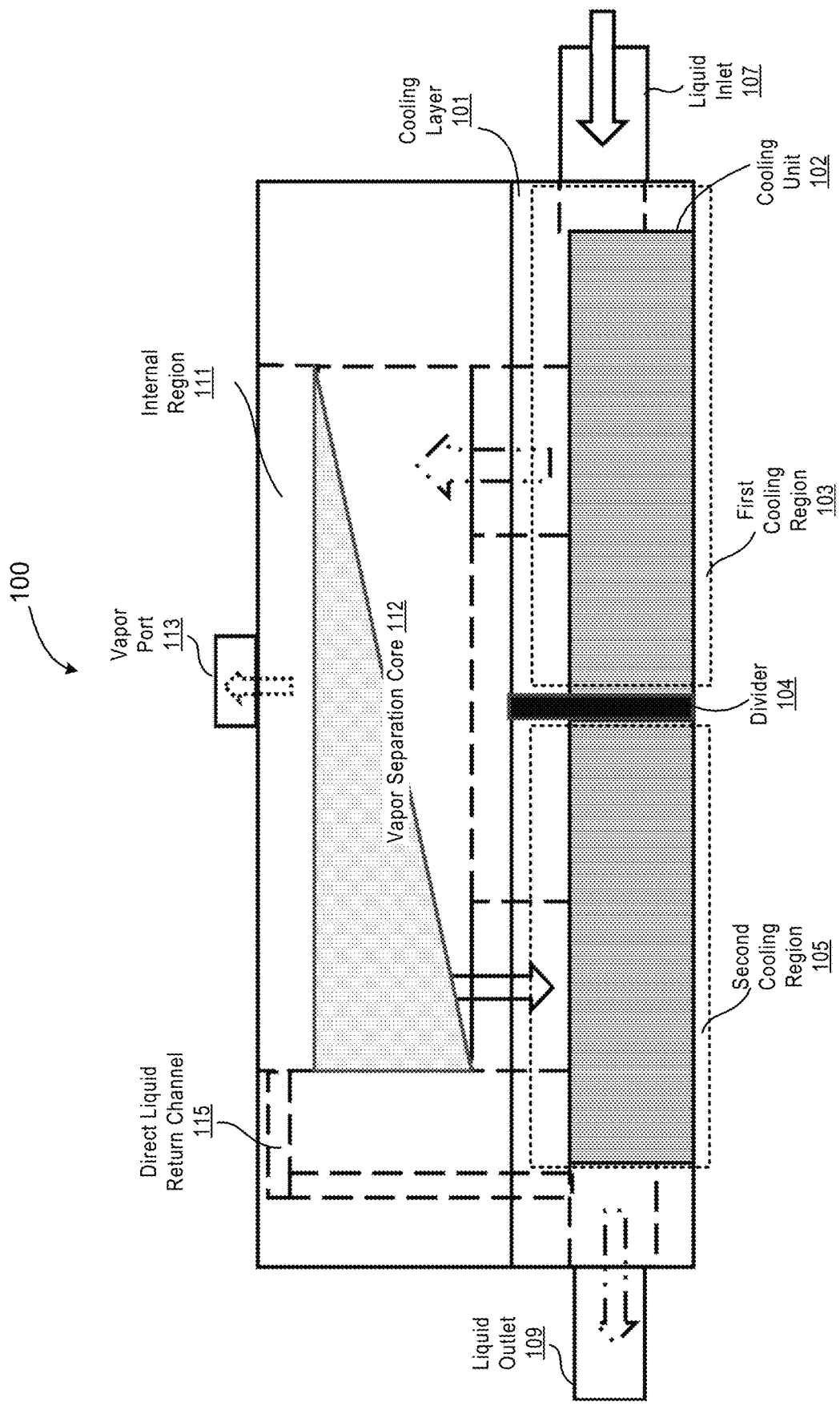
FIG. 1 shows a cooling device according to an embodiment of the invention.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to various embodiments, this disclosure describes a cooling device, a server with the cooling device, and a rack with multiple such servers.

In an embodiment, the cooling device comprises a cooling layer that is attached to a chip and that includes a first cooling region and a second cooling region; and an internal region that is positioned on top of the cooling layer and that includes a vapor separation core. The first cooling region generates mixed fluid from two-phase coolant entering the first cooling region due to heat extracted from the chip. The vapor separation core operates to extract at least a portion of vapor from the mixed fluid, and the mixed fluid with the at least portion of vapor extracted is distributed to the second cooling region.

In an embodiment, the cooling layer includes a cooling unit, a liquid inlet, and a liquid outlet. The cooling unit is either a cooling fins unit or a cooling plate. The cooling device further includes a direct liquid return channel that connects a vapor path of the cooling device and the cooling layer either at the liquid inlet or at the liquid outlet. The direct liquid return channel transports at least a portion of liquid in the at least portion of vapor extracted by the vapor separation core to the cooling layer.

In an embodiment, the cooling device further a vapor port on top of the cooling device. The vapor port discharges the at least portion of vapor extracted by the vapor separation core.

In an embodiment, the first cooling region and the second cooling region are created by a first divider. The first divider substantially blocks two-phase coolant and mixed fluid in each cooling region from directly entering another cooling region.

In an embodiment, once the mixed fluid with the at least portion of vapor extracted is distributed to the second cooling region, it continues to extract heat from the chip to generate reheated mixed fluid. The reheated mixed fluid exits the cooling device via the liquid outlet connected to the cooling layer.

In an embodiment, the first cooling and the second cooling region are to cool a separate region on the chip. The size of each cooling region is based on the power density of the corresponding region on the chip.

In an embodiment, the server includes a condenser, and a cooling device disposed below the condenser for cooling a chip of the server. The condenser operates to condense the at least portion of vapor to liquid for distribution to the cooling layer of the cooling device.

In one embodiment, the server can include a cooling fluid circulation between the rack and the condenser for cooling the vapor through the condenser condenser (the condenser can be understood as a server internal condenser); a two-phase coolant circulation that elevates the vapor portion of the mixed fluid from the cooling device to a second and external condenser and recirculates the liquid portion of the mixed fluid back to the cooling device; and an internal two-phase circulation between the cooling device and the internal condenser. In this disclosure, the cooling fluid circulation is also referred to a rack loop or a rack cooling fluid loop, the two-phase coolant circulation is also referred to as a main fluid loop, and the internal two-phase circulation is also referred to as a server internal loop. The server may connect with the rack cooling fluid loop and also connect to a rack two-phase coolant loop.

In an embodiment, a cooling system for a server rack comprises a plurality of server-level cooling systems. Each server-level cooling system is integrated into the server rack via the liquid inlet and the liquid outlet of the server-level cooling system to connect with a rack liquid supply and a liquid return of the server rack. The server-level cooling system receives liquid from the rack liquid supply via the liquid inlet, and returns liquid back to the rack liquid return via the liquid outlet. The liquid from the condenser and the liquid received from the rack are to maintain a predetermined liquid balance in the cooling device.

The various embodiments described above can provide an efficient heat extracting design, a non-uniform power mapping on a single chip or a device, efficient thermal management for high power density chips, and redundant design. The embodiments can also accommodate different server hardware and electronics components, and provide efficient two-phase fluid management for different cooling systems with high reliability.

The above summary does not include an exhaustive list of all embodiments in this disclosure. All apparatuses in this disclosure can be practiced from all suitable combinations of the various aspects and embodiments described in the disclosure.

FIG. 1 shows a cooling device 100 according to an embodiment of the invention. The cooling device 100 includes a cooling layer 101, an internal region 111, and a direct liquid return channel 115.

The cooling layer 101 is disposed at the bottom of the cooling device 100, which can be in close contact with a chip to extract heat from the chip. In one embodiment, the cooling layer 101 can include a cooling unit 102, a liquid inlet 107, and a liquid outlet 109. Through the liquid inlet 107, two-phase coolant can enter the cooling layer 101 from an external source (e.g., a rack supply port of a rack), and can be distributed through the cooling unit 102, which can be a cooling fins unit or a cooling plate.

In one embodiment, the cooling layer 101 can be divided into a first cooling region 103 and a second cooling region 105 by a divider 104. The two cooling regions 103 and 105 are completely separate from each other. The divider 104 can be a metal plate made of various materials (e.g. copper) designed to block liquid, vapor, and/or mixed liquid in the first cooling region 103 from entering the second cooling region 105, and vice versa.

In one embodiment, each of the first cooling region 103 and the second cooling region 105 can be attached to a different portion of a chip to satisfy the different power densities and thermal management requirements of the different portions of the chip.

When the two-phase coolant enters the cooling layer 101 via the liquid inlet 107, the two-phase coolant can be distributed in the portion of the cooling unit 102 in the first cooling region 103. Due to heat extracted from the portion of the chip attached to the first cooling region 103, the two-phase coolant can be converted into mixed liquid, which is a mixture of liquid and vapor. The mixed fluid can be elevated to the internal region 111 due to the lower density of the mixed fluid.

The internal region 111 is a container that can be made of various metals, such as copper. The internal region 111 is disposed on top of the cooling layer 101, and can be filled with the mixed fluid generated by the cooling layer 101. The internal region 111 can include a vapor separation core 112 that can introduce resistance to fluid in the mixed fluid and assist in separating vapor and liquid in the mixed fluid.

In one embodiment, the vapor separation core 112 can be a mechanical device, which operates to cause liquid that is denser to settle to the bottom of the internal region 111, and cause vapor that is less dense to be pushed to the top of the internal region 111. The vapor pushed to the top of the internal region 111 can exit the cooling device 100 via a vapor port 113 on the top of the entire cooling device 100. The liquid portion (also including a small portion of vapor) can be distributed to the second cooling region 105 due to a combination effect of gravity and the dragging force of an active fluid mover (e.g., a pump) connected to the liquid outlet 109.

In the second cooling region 105, the liquid portion distributed from the internal region 111 can be converted to mixed fluid due to heat extracted from the corresponding portion of the chip. The mixed fluid in the second cooling region 105 can be dragged out of the cooling layer 101 via the liquid outlet 109. Since the liquid portion also includes some vapor, the liquid portion can be considered mixed fluid. The liquid portion being reheated can be considered as the mixed fluid being reheated.

As further shown in FIG. 1, the cooling device 100 further includes a direct liquid return channel 115 that connects the vapor path and the liquid outlet 109. In one embodiment, the vapor pushed to the top portion of the internal region 111 may still contain some liquid, and the direct liquid return channel 115 can be used to transport any potential liquid in the vapor to the liquid outlet 109. Thus, the direct liquid return channel 115 can help the cooling device 100 keep liquid in a liquid recirculation loop steady. The vapor separation core 112 can be designed in different shapes for optimization purpose.

Figure 2:
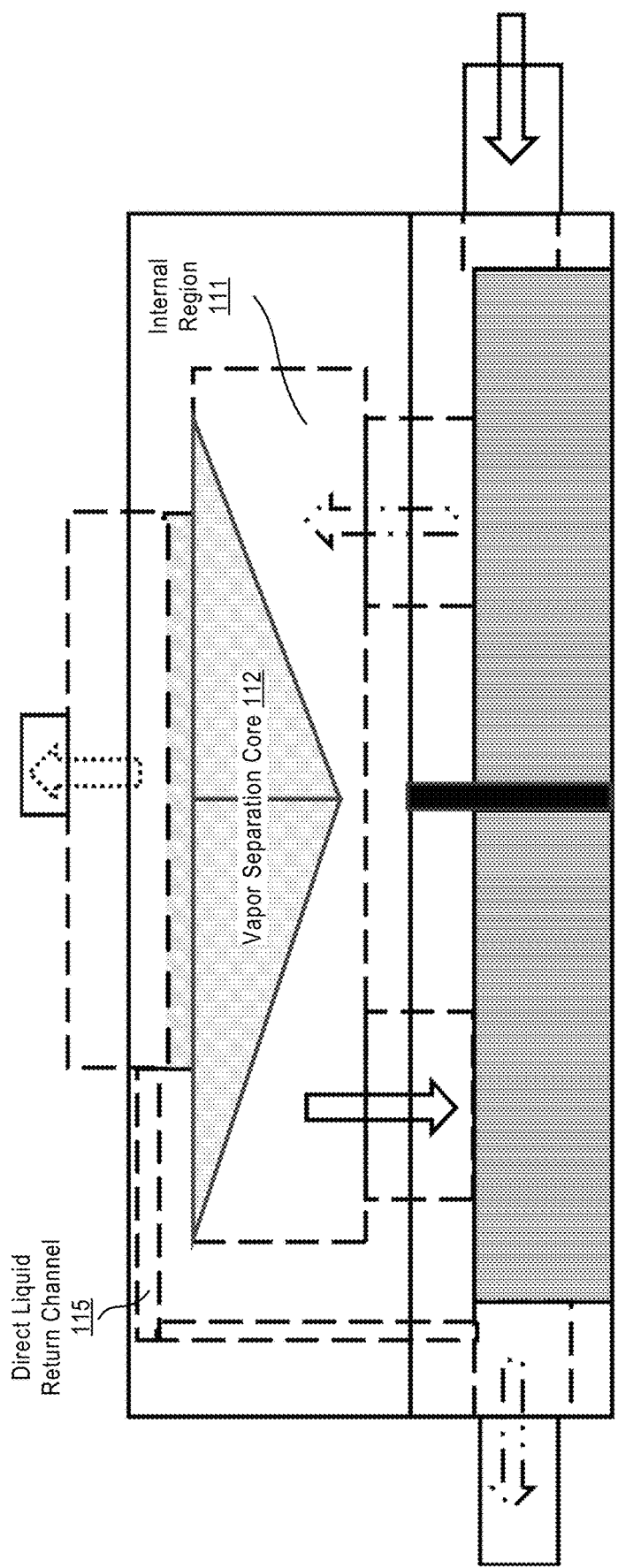
FIG. 2 shows a modified design of the cooling device according to an embodiment of the invention.

FIG. 2 shows a modified design of the vapor separation core 112 within the internal region 111 of the cooling device 100 according to an embodiment of the invention.

The vapor separation core 112 in this embodiment is an optimized design to generate a non-uniformed pressure environment for better separation of the vapor and liquid in mixed fluid. A pressure analysis can be conducted in order to generate the pressure environment with regions of different pressures. Such a non-uniform pressure environment can induce vapor to a particular region and liquid to another region, thus separating the vapor and the liquid.

Figure 3:
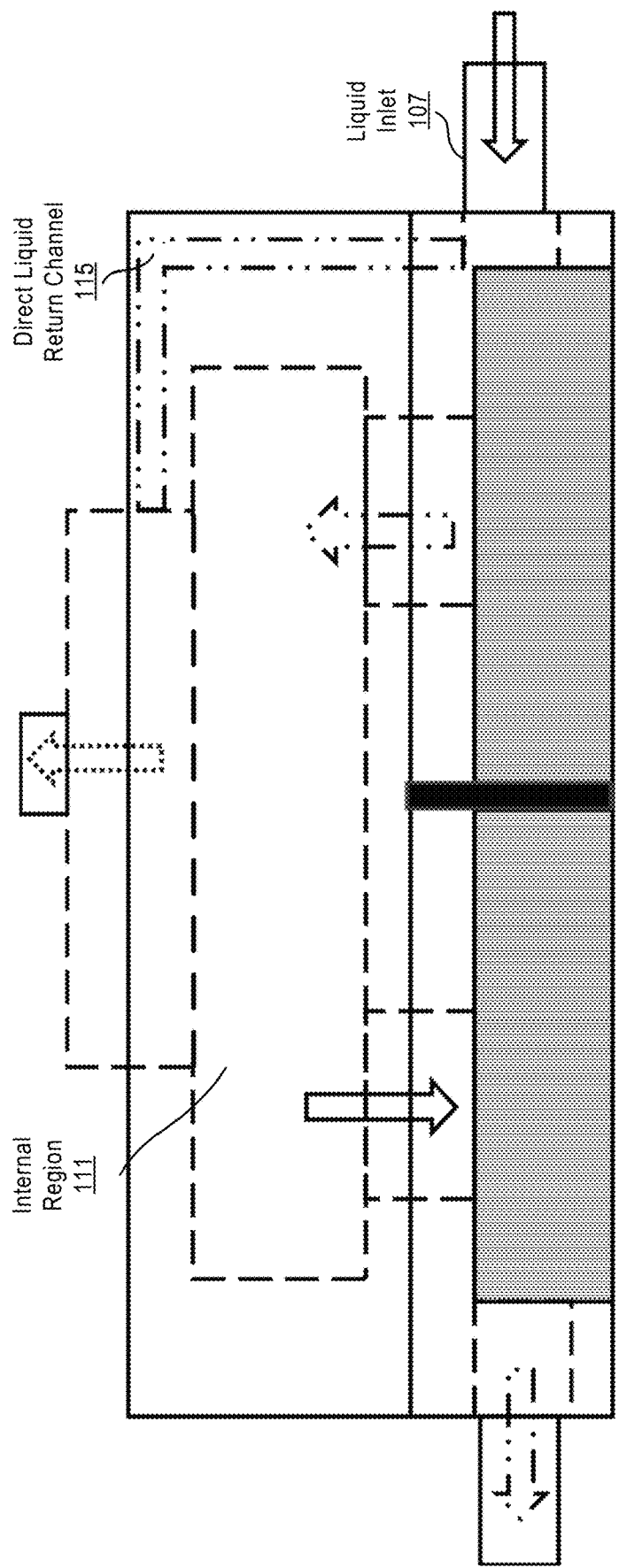
FIG. 3 shows another modified design of the cooling device according to an embodiment of the invention.

FIG. 3 shows another modified design of the cooling device 100 according to an embodiment of the invention. In this embodiment, the direct return liquid return channel 115 is on the side of the liquid inlet 107 to connect the vapor path and the liquid inlet 107. Through the direct liquid return channel 115, any potential liquid in the vapor pushed to the top portion of the internal region 111 can be transported to the liquid inlet 107 to improve the liquid utilization efficiency of the cooling device 100.

As described above in FIG. 1, the direct liquid return channel 115 can also be on the side of the liquid outlet 109. Such a design can more easily extract potential liquid from the vapor in the top portion of the internal regions 111 due to the low-pressure region created in the area around the liquid outlet 109 by a pump connected to the liquid outlet 109.

The position of the direct liquid return loop can be determined based on the actual requirements of the cooling device 100.

Figure 4:
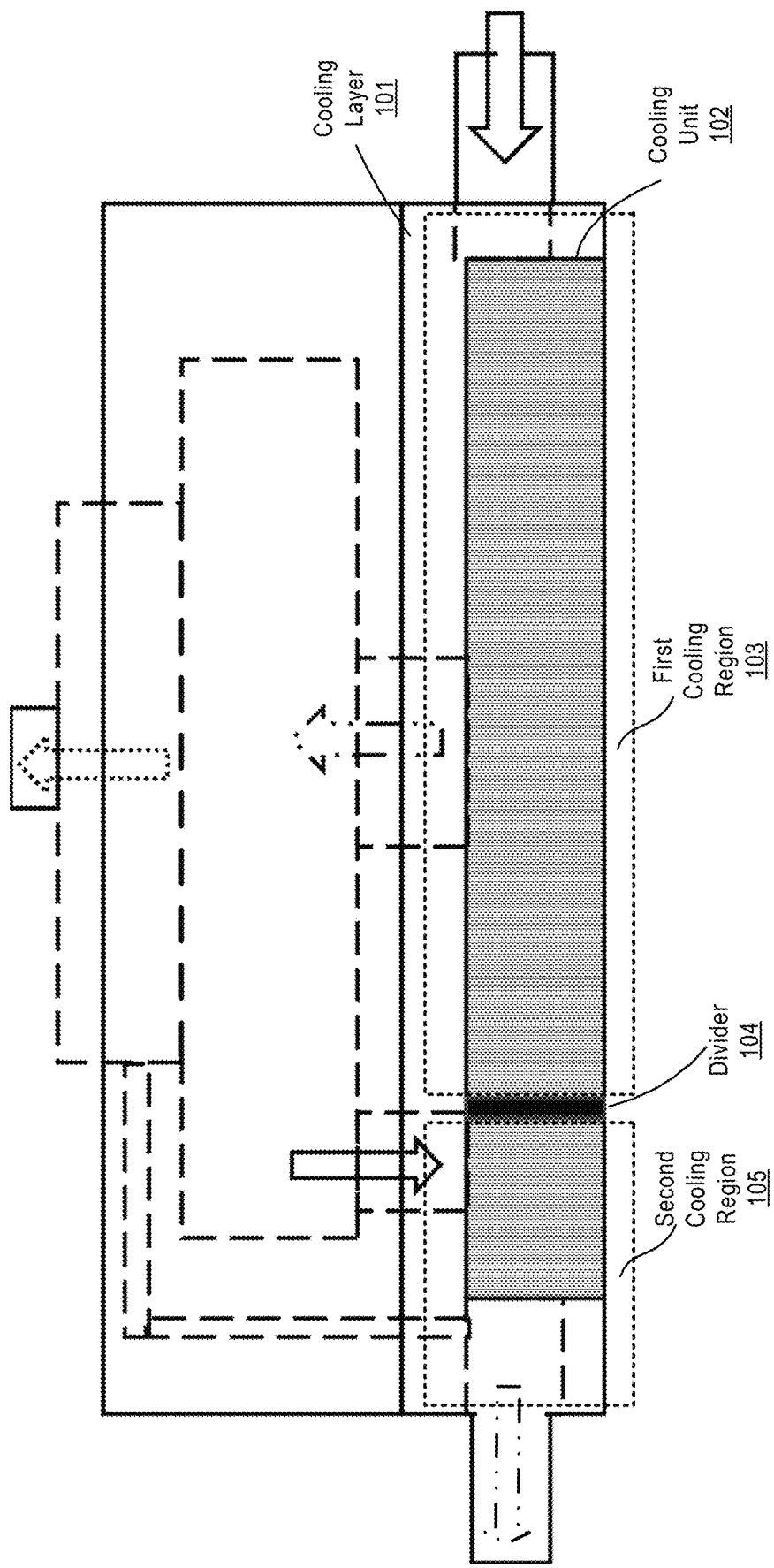
FIG. 4 shows the cooling device according to another embodiment of the invention.

FIG. 4 shows the cooling device 100 according to another embodiment of the invention. This embodiment shows that that the cooling device 100 can be customized to accommodate the cooling needs of different chip configurations.

As shown, the cooling layer 101 is divided in differently compared to FIG. 1 in that the first cooling region 103 in FIG. 3 is larger than the corresponding region in FIG. 1. Such a division is to provide more cooling capacity to the corresponding portion of the chip attached to the first cooling region 103, for example, because the corresponding portion of the chip has a higher power density. Further, due to the division of the cooling layer 101, heat spreading structures and fluid paths can also be modified accordingly in this embodiment.

Figure 5:
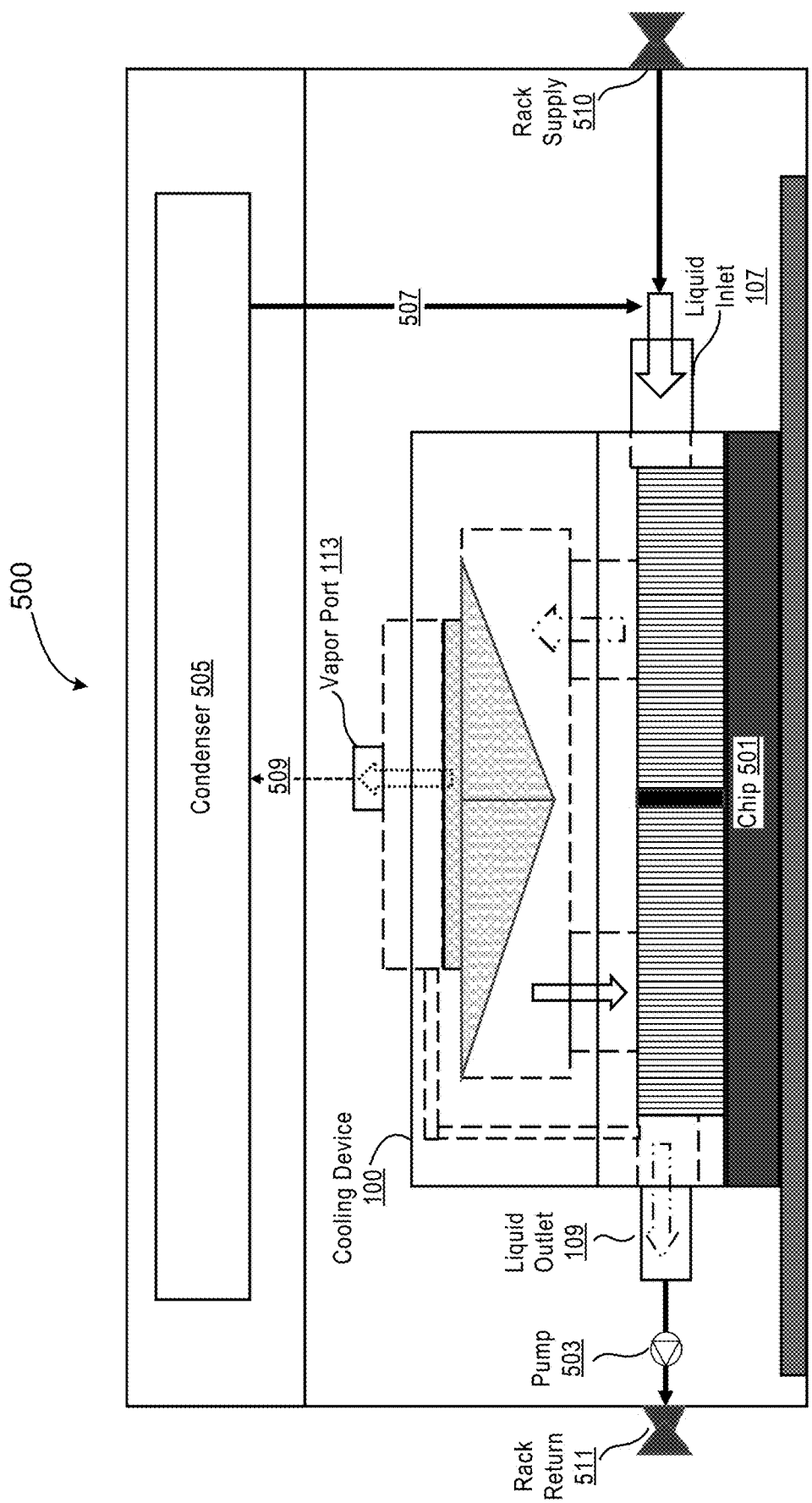
FIG. 5 shows a server with a cooling system including the cooling device according to an embodiment of the invention.

FIG. 5 shows a server 500 with a cooling system including the cooling device 100 according to an embodiment of the invention. In server 500, cooling device 100 is coupled to a chip 501.

As shown in FIG. 5, the liquid outlet 109 and the liquid inlet 107 are connected with a rack return port 511 and a rack supply port 510 respectively. The rack return port 511 is a port for receiving the mixed fluid (i.e., liquid with a small amount of vapor) exiting the cooling device 100 via the liquid outlet 109, and the rack supply port 510 is a port for suppling two-phase coolant to the cooling device 100 via the liquid inlet 107.

In this embodiment, a pump 503 for pulling the mixed fluid out of the cooling device 100 is disposed on the side of the liquid outlet 109. Further, the vapor port 113 is connected to an internal condenser 505 of the server 500. The internal condenser 505 is disposed on top of the entire cooling device 100 and is connected to the liquid inlet 107.

Thus, the server 500 can include a server internal loop formed by the cooling device 100, a pipe segment 509, the condenser 505, a pipe segment 507. In this loop, vapor exiting the cooling device 100 via the vapor port 113 is elevated to the condenser 505, where the vapor is converted into liquid for distribution back to the cooling device 100 via the liquid inlet 107 through a pipe segment 507.

Figure 6:
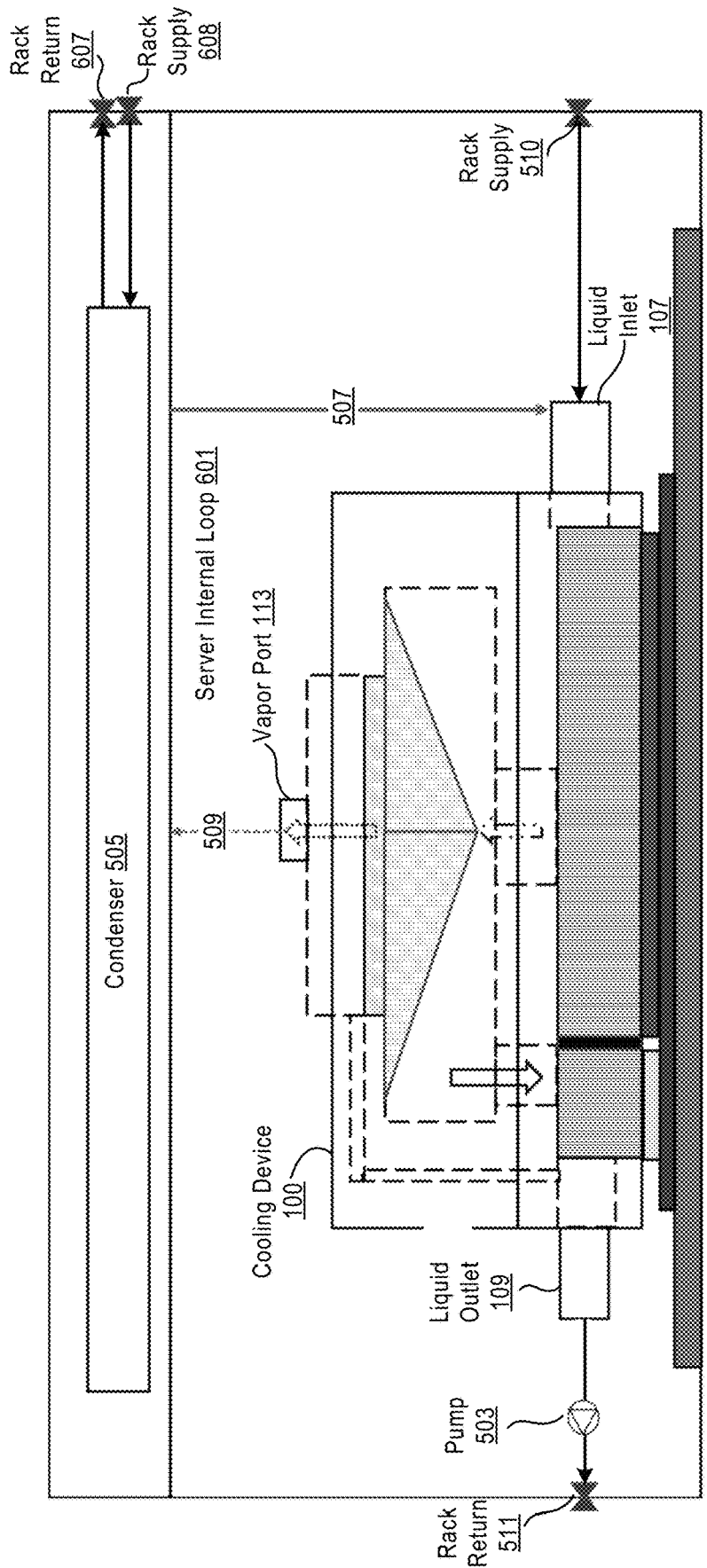
FIG. 6 shows the server with the cooling system when the two-phase fluid in the main fluid loop is in idle condition according to an embodiment of the invention.

FIG. 6 shows the server when the two-phase coolant in the main fluid loop is in an idle condition according to an embodiment of the invention.

Such a case can happen, for example, when the pump 503 malfunctions or when rack-level issues occur that would cause the two-phase coolant in the main fluid loop to be idle.

In such a case, there would be no active pumping by the pump 503 from the liquid outlet 109, and the mixed fluid in the cooling device 100 can automatically flow between the cooling device 100 and the condenser 505, forming a server internal loop 601, which has a similar mechanism as a thermosiphon loop. The server internal loop 601 can be used to recirculate the two-phase coolant in the cooling device 100, and the loop may continue to function when the main fluid loop is not functioning properly for any reason, for example, when the pump 503 malfunctions.

FIG. 6 also illustrates the rack loop. The rack loop can also be understood as a rack cooling fluid loop for cooling vapor in the internal condenser 505. The cooling fluid in the loop can be cooling water in an embodiment. As shown, the cooling fluid can be pumped via a pump (not shown in this figure) via a rack supply port 608, and can recirculate back to the rack via a rack return port 607. The serval internal loop and the main fluid loop will be further described in FIG. 7.

Figure 7:
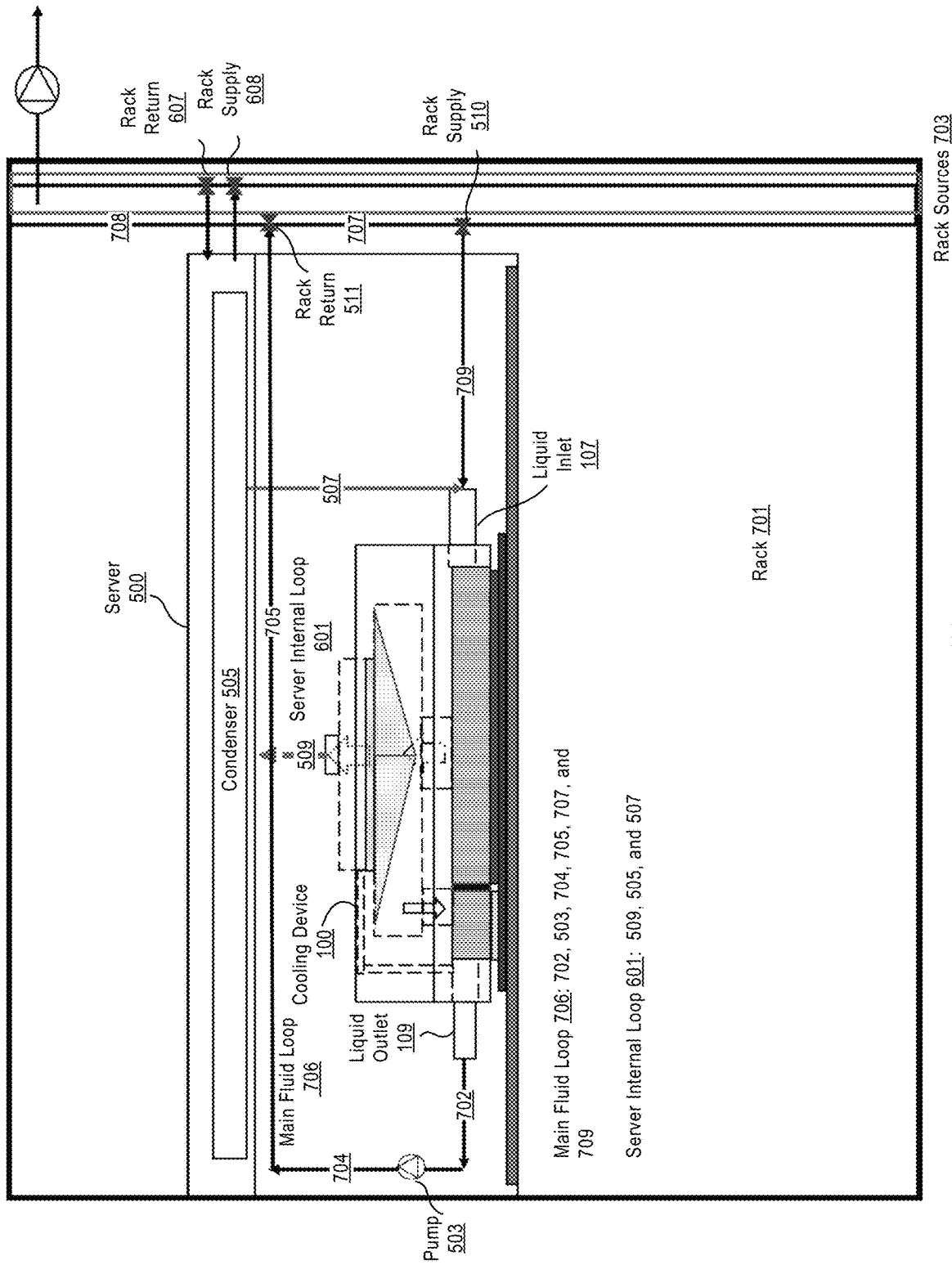
FIG. 7 shows a rack implementation according to an embodiment of the invention.

FIG. 7 shows a rack implementation according to an embodiment of the invention. As shown, the server 500 with the cooling device 100 can be disposed in a rack 701, which includes multiple rack sources 703 for distributing two-phase coolant as well as for distributing cooling fluid for cooling the condenser 505.

This embodiment shows the server internal loop 601, the main fluid loop 706, and the rack loop. The rack loop recirculates cooling fluid between the condenser 505 and the rack 701 via the rack supply port 608 and the rack return port 507. The server internal loop 601 for the two-phase coolant is carried out in a thermosiphon-like loop, and the main fluid loop 706 comprises pipe segments 702, 704, 705, 707 and 709 and the pump 503.

Please note that in this disclosure, all the figures are 2-D schematic figures. Thus, in FIG. 7, all the ports shown on the rack 701 are conceptual and may not actually depict the actual implementations. For example, the rack return port 607 and the rack supply port 608 are shown on the same pipe in this schematic figure, but in actual implementation, the two ports 607 and 608 are on two different pipes or namely fluid manifolds. The ports 607 and 608 are on the rack cooling fluid loop, with, for example, cooling water running through these ports. The ports 510 and 511 are two-phase coolant loop ports with liquid phase fluid running through the port 510 and mixed two-phase fluid running through the port 511.

In one embodiment, the main fluid loop 706 is designed for elevating the vapor portion of the mixed fluid from the cooling device 100 via the rack return port 511 to an external condenser (not shown), and for directly returning the liquid portion back to the cooling device 100 via the rack supply port 510.

More specifically, when the mixed fluid is pulled out of the cooling device 100 by the pump 503, the mixed fluid can return to the rack 701 at the rack return 511. However, at the rack return port 511, the vapor portion of the mixed fluid is elevated to the external condenser via a pipe segment 708, and the liquid portion directly returns to the cooling device 100 through the pipe segments 707 and 709.

In one embodiment, the server internal loop 601 and the main loop 706 in combination can maintain a predetermined balance of cooling coolant for the cooling device 100. Multiple sensors can be provided in the rack 701 to monitor the volume of cooling coolant passing through each loop. The server internal loop 601 is primarily responsible for supplying the two-phase coolant needed by the cooling device 100 to cool the chip. If the volume of two-phase coolant recirculated back by the server internal loop 601 to the liquid inlet 107 is below the volume needed, the main fluid loop 706 can make up the difference.

For example, if the cooling device 100 needs a gallons of two-phase coolant to as the desired supply coolant flow rate to cool the chip, but only b gallons of two-phase coolant is recirculated back to the liquid inlet 107 via the condenser 505 and the pipe segment 507, then the sensors and the main fluid loop 706 can provide a-b additional gallons of two-phase coolant to the cooling device 100.

Figure 8:
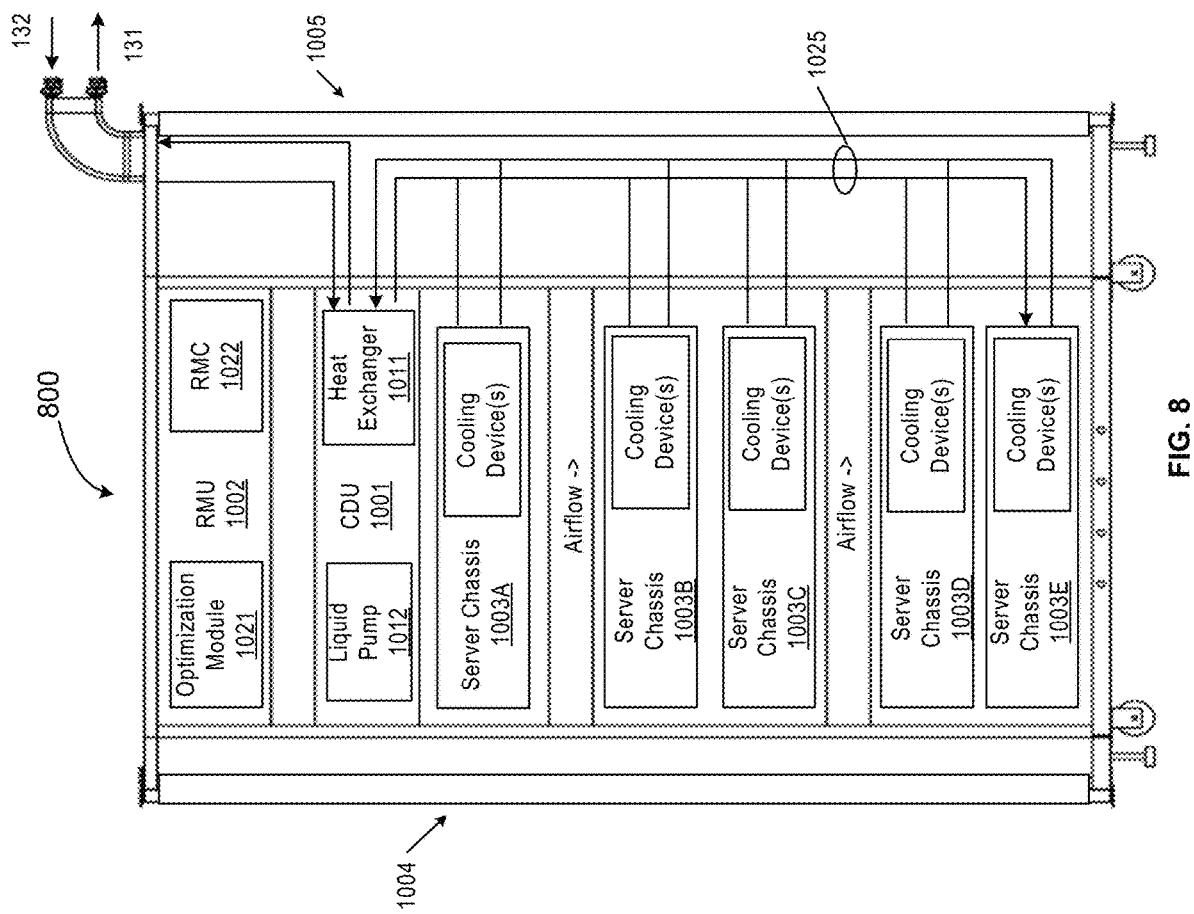
FIG. 8 is block diagram illustrating an electronic rack according to one embodiment.

FIG. 8 is block diagram illustrating an electronic rack according to one embodiment. Electronic rack 800 may represent any of the electronic racks of a data center. Referring to FIG. 8, according to one embodiment, electronic rack 800 includes, but is not limited to, CDU 1001, rack management unit (RMU) 1002, and one or more server chassis 1003A-1003E (collectively referred to as server chassis 1003). Server chassis 1003 can be inserted into an array of server slots (e.g., standard shelves) respectively from frontend 1004 or backend 1005 of electronic rack 800. Note that although there are five server chassis 1003A-1003E shown here, more or fewer server chassis may be maintained within electronic rack 800. Also note that the particular positions of CDU 1001, RMU 1002, and/or server chassis 1003 are shown for the purpose of illustration only;

other arrangements or configurations of CDU 1001, RMU 1002, and/or server chassis 1003 may also be implemented. In one embodiment, electronic rack 800 can be either open to the environment or partially contained by a rack container, as long as the cooling fans can generate airflows from the frontend to the backend.

In addition, for at least some of the server chassis 1003, an optional fan module (not shown) is associated with the server chassis. Each of the fan modules includes one or more cooling fans. The fan modules may be mounted on the backends of server chassis 1003 or on the electronic rack to generate airflows flowing from frontend 1004, traveling through the air space of the sever chassis 1003, and existing at backend 1005 of electronic rack 800.

In one embodiment, CDU 1001 mainly includes heat exchanger 1011, liquid pump 1012, and a pump controller (not shown), and some other components such as a liquid reservoir, a power supply, monitoring sensors and so on. Heat exchanger 1011 may be a liquid-to-liquid heat exchanger. Heat exchanger 1011 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 1005 of electronic rack 800. The liquid supply/return lines 131-132, also referred to as room liquid supply/return lines, may be coupled to an external cooling system (e.g., a data center room cooling system).

In addition, heat exchanger 1011 further includes a second loop with two ports having a second pair of liquid connectors coupled to liquid manifold 1025 (also referred to as a rack manifold) to form a secondary loop, which may include a supply manifold (also referred to as a rack liquid supply line or rack supply manifold) to supply cooling liquid to server chassis 1003 and a return manifold (also referred to as a rack liquid return line or rack return manifold) to return warmer liquid back to CDU 1001. Note that CDUs 1001 can be any kind of CDUs commercially available or customized ones. Thus, the details of CDUs 1001 will not be described herein.

Each of server chassis 1003 may include one or more IT components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. Server chassis 1003 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

Electronic rack 800 further includes optional RMU 1002 configured to provide and manage power supplied to servers 1003, and CDU 1001. RMU 1002 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to the rest of the components of electronic rack 800.

In one embodiment, RMU 1002 includes optimization module 1021 and rack management controller (RMC) 1022. RMC 1022 may include a monitor-to-monitor operating status of various components within electronic rack 800, such as, for example, computing nodes 1003, CDU 1001, and the fan modules. Specifically, the monitor receives operating data from various sensors representing the operating environments of electronic rack 800. For example, the monitor may receive operating data representing temperatures of the processors, cooling liquid, and airflows, which may be captured and collected via various temperature sensors. The monitor may also receive data representing the fan power and pump power generated by the fan modules and liquid pump 1012, which may be proportional to their respective speeds. These operating data are referred to as real-time operating data. Note that the monitor may be implemented as a separate module within RMU 1002.

Based on the operating data, optimization module 1021 performs an optimization using a predetermined optimization function or optimization model to derive a set of optimal fan speeds for the fan modules and an optimal pump speed for liquid pump 1012, such that the total power consumption of liquid pump 1012 and the fan modules reaches minimum, while the operating data associated with liquid pump 1012 and cooling fans of the fan modules are within their respective designed specifications. Once the optimal pump speed and optimal fan speeds have been determined, RMC 1022 configures liquid pump 1012 and cooling fans of the fan modules based on the optimal pump speeds and fan speeds.

As an example, based on the optimal pump speed, RMC 1022 communicates with a pump controller of CDU 1001 to control the speed of liquid pump 1012, which in turn controls a liquid flow rate of cooling liquid supplied to the liquid manifold 1025 to be distributed to at least some of server chassis 1003. Similarly, based on the optimal fan speeds, RMC 1022 communicates with each of the fan modules to control the speed of each cooling fan of the fan modules, which in turn control the airflow rates of the fan modules. Note that each of fan modules may be individually controlled with its specific optimal fan speed, and different fan modules and/or different cooling fans within the same fan module may have different optimal fan speeds.

Note that the rack configuration as shown in FIG. 8 is shown and described for the purpose of illustration only; other configurations or arrangements may also be applicable. For example, CDU 1001 may be an optional unit. The cold plates of server chassis 1003 may be coupled to a rack manifold, which may be directly coupled to room manifolds 131-132 without using a CDU. Although not shown, a power supply unit may be disposed within electronic rack 800. The power supply unit may be implemented as a standard chassis identical or similar to a sever chassis, where the power supply chassis can be inserted into any of the standard shelves, replacing any of server chassis 1003. In addition, the power supply chassis may further include a battery backup unit (BBU) to provide battery power to server chassis 1003 when the main power is unavailable. The BBU may include one or more battery packages and each battery package include one or more battery cells, as well as the necessary charging and discharging circuits for charging and discharging the battery cells.

In one embodiment, the cooling devices disposed in each of the server chassis as shown may represent any cooling device described throughout this application.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

As previously explained, an embodiment of the disclosure may be (or include) a non-transitory machine-readable medium (such as microelectronic memory) having stored thereon instructions, which program one or more data processing components (generically referred to here as a "processor") to perform airflow management operations, such as controlling fan speed of one or more fans of the battery module (and/or BBU shelf). In other embodiments, some of these operations might be performed by specific hardware components that contain hardwired logic. Those operations might alternatively be performed by any combination of programmed data processing components and fixed hardwired circuit components of any of the battery modules described herein.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A cooling device for cooling a chip, comprising:
   a cooling layer attached to the chip and including a first cooling region and a second cooling region; and
   an internal region positioned on top of the cooling layer, wherein the internal region includes a vapor separation core;
   wherein the first cooling region generates mixed fluid from two-phase coolant due to heat extracted from the chip,
   wherein the vapor separation core operates to extract at least a portion of vapor from the mixed fluid,
   wherein the mixed fluid with the at least portion of vapor extracted is distributed to the second cooling region, and
   wherein the first cooling region and the second cooling region are created by a first divider, wherein the first divider substantially blocks the two-phase coolant and the mixed fluid in each cooling region from directly entering another cooling region.

2. The cooling device of claim 1, wherein the cooling layer includes a cooling unit, a liquid inlet, and a liquid outlet.

3. The cooling device of claim 2, further comprising:
   a direct liquid return channel that connects a vapor path of the cooling device and the cooling layer at the liquid inlet or at the liquid outlet;
   wherein the direct liquid return channel transports at least a portion of liquid in the at least portion of vapor extracted by the vapor separation core to the cooling layer.

4. The cooling device of claim 1, further comprising:
   a vapor port disposed on top of the cooling device, wherein the vapor port discharges the at least portion of vapor extracted from the mixed fluid.

5. The cooling device of claim 1, wherein the mixed fluid with the at least portion of vapor extracted that has been transported to the second cooling region continues to extract heat from the chip, wherein the reheated mixed fluid exits the cooling device via a liquid outlet connected to the cooling layer.

6. The cooling device of claim 5, wherein the first cooling region and the second cooling region are to cool separate regions of chips.

7. A server cooling system, comprising:
   a condenser; and
   a cooling device disposed below the condenser, the cooling device comprising:
   a cooling layer attached to a chip and including a first cooling region and a second cooling region; and
   an internal region positioned on top of the cooling layer, wherein the internal region includes a vapor separation core;
   wherein the first cooling region generates mixed fluid from two-phase coolant due to heat extracted from the chip,
   wherein the vapor separation core operates to extract at least a portion of vapor from the mixed fluid,
   wherein the mixed fluid with the at least portion of vapor extracted is distributed to the second cooling region,
   wherein the condenser operates to condense the at least portion of vapor to liquid for distribution to the cooling layer of the cooling device, and
   wherein the first cooling region and the second cooling region are created by a first divider, wherein the first divider substantially blocks the two-phase coolant and the mixed fluid in each cooling region from directly entering another cooling region.

8. The server cooling system of claim 7, wherein the cooling layer includes a cooling unit, a liquid inlet, and a liquid outlet.

9. The server cooling system of claim 8, wherein the cooling device further includes a direct liquid return channel that connects a vapor path of the cooling device and the cooling layer at the liquid inlet or at the liquid outlet, wherein the direct liquid return channel transports at least a portion of liquid in the at least portion of vapor extracted from the mixed fluid to the cooling layer.

10. The server cooling system of claim 7, wherein the cooling device further includes a vapor port disposed on top of the cooling device, wherein the vapor port discharges the at least portion of vapor extracted from the mixed fluid.

11. The server cooling system of claim 7, wherein the mixed fluid with the at least portion of vapor extracted that has been transported to the second cooling region continues to extract heat from the chip, wherein the reheated mixed fluid exits the cooling device via a liquid outlet connected to the cooling layer.

12. A cooling system for a server rack, comprising:
a plurality of server-level cooling systems corresponding to a plurality of server chassis, wherein each server-level cooling system includes a condenser and a cooling device disposed below the condenser, the cooling device comprising:
a cooling layer to be attached to a chip and including a first cooling region and a second cooling region;
an internal region positioned on top of the cooling layer, wherein the internal region includes a vapor separation core; and
a direct liquid return channel that connects a vapor path of the cooling device and the cooling layer at a liquid inlet or at a liquid outlet of the cooling device, wherein the direct liquid return channel transports at least a portion of liquid in the at least portion of vapor extracted by the vapor separation core from mixed fluid;
wherein the first cooling region generates mixed fluid from two-phase coolant due to heat extracted from the chip;
wherein the vapor separation core operates to extract at least a portion of vapor from the mixed fluid; and
wherein the mixed fluid with the at least portion of vapor extracted is distributed to the second cooling region;
wherein the condenser operates to condense the at least portion of vapor to liquid for distribution to the cooling layer of the cooling device;
wherein the liquid inlet and the liquid outlet of each cooling device are to receive liquid from a rack liquid supply and to return liquid back to a rack liquid return respectively; and
wherein the liquid from the condenser and the liquid received from the server rack are to maintain a predetermined liquid balance in the cooling device, and
wherein the first cooling region and the second cooling region are formed by a first divider, wherein the first divider substantially blocks the two-phase coolant and the mixed fluid in each cooling region from directly entering another cooling region.

13. The cooling system of to claim 12, wherein when the liquid from a condenser alone is sufficient to maintain the predetermined liquid balance, the corresponding server-level cooling system stops receiving the liquid from the rack liquid supply.

14. The cooling system of to claim 12, wherein the cooling device further includes a vapor port disposed on top of the cooling device, where the vapor port discharges the at least portion of vapor extracted from the mixed fluid.

15. The cooling system of to claim 12, wherein the mixed fluid with the at least portion of vapor extracted that has been transported to the second cooling region is also heated by the chip, wherein the reheated mixed fluid exits the cooling device via the liquid outlet connected to the cooling layer.

16. The cooling system of to claim 12, wherein the mixed fluid with the at least portion of vapor extracted that has been transported to the second cooling region continues to extract heat from the chip, wherein the reheated mixed fluid exits the cooling device via the liquid outlet connected to the cooling layer.

17. The cooling system of to claim 16, wherein the first cooling region and the second cooling region are to cool separate regions of chips.

* * * * *